(12) United States Patent
Atlas

(10) Patent No.: US 8,903,249 B2
(45) Date of Patent: Dec. 2, 2014

(54) METHOD AND APPARATUS FOR SUPPRESSING OPTICAL BEAT INTERFERENCE NOISE IN RAMAN AMPLIFIERS

(75) Inventor: Dogan Atlas, Johns Creek, GA (US)

(73) Assignee: ADVA Optical Networking SE, Meiningen OT Dreissigacker (DE)

( * ) Notice: Subject to any disclaimer, the term of this patent is extended or adjusted under 35 U.S.C. 154(b) by 61 days.

(21) Appl. No.: 13/600,458

(22) Filed: Aug. 31, 2012

(65) Prior Publication Data

US 2014/0064728 A1  Mar. 6, 2014

(51) Int. Cl.
| | |
|---|---|
| H04B 10/00 | (2013.01) |
| H04B 10/2507 | (2013.01) |
| H04J 14/06 | (2006.01) |
| H04J 14/02 | (2006.01) |
| H04B 10/291 | (2013.01) |
| H01S 5/04 | (2006.01) |

(52) U.S. Cl.
CPC ............ *H04J 14/02* (2013.01); *H04B 10/2507* (2013.01); *H04J 14/06* (2013.01); *H04B 10/2916* (2013.01); *H01S 5/041* (2013.01)
USPC ........... 398/158; 398/159; 398/160; 398/157; 398/92; 398/65; 398/152; 398/33; 398/177; 398/173; 359/334; 359/341.3; 359/337

(58) Field of Classification Search
USPC ............... 398/158, 159, 160, 92, 79, 82, 177, 398/181, 95, 173, 65, 152, 157, 33, 180; 359/334, 341.3, 341.33, 337
See application file for complete search history.

(56) References Cited

U.S. PATENT DOCUMENTS

| | | | |
|---|---|---|---|
| 6,359,725 B1 | 3/2002 | Islam | |
| 6,646,786 B1 | 11/2003 | Meli et al. | |
| 6,654,162 B2 * | 11/2003 | Akasaka et al. | 359/334 |
| 7,054,059 B1 | 5/2006 | Meli et al. | |
| 2003/0210457 A1 * | 11/2003 | Emori et al. | 359/334 |
| 2004/0032641 A1 * | 2/2004 | Namiki et al. | 359/334 |
| 2008/0291529 A1 * | 11/2008 | Onaka et al. | 359/334 |
| 2010/0073762 A1 * | 3/2010 | Onaka | 359/334 |

OTHER PUBLICATIONS

European Search Report for Application No. 13176936.6 dated Nov. 27, 2013.
Eui S. Son et al.: "Pump-to-signal crosstalk in Raman amplifier systems using polarization-multiplexed pump lasers", Proceedings of SPIE, vol. 4906, Aug. 23, 2002. pp. 35-42.

* cited by examiner

*Primary Examiner* — Hanh Phan
(74) *Attorney, Agent, or Firm* — Jenkins, Wilson, Taylor & Hunt, P.A.

(57) ABSTRACT

A method and apparatus for suppressing pump-mode optical beat interference noise in a Raman amplified fiber link of an optical network, wherein a wavelength of a laser beam generated by a first pump laser and a wavelength of a laser beam generated by a second pump laser of a pair of polarization multiplexed pump lasers are detuned with respect to each other to suppress the optical beat interference, OBI, noise in the Raman amplified fiber link of said optical network.

13 Claims, 5 Drawing Sheets

METHOD AND APPARATUS FOR SUPPRESSING OPTICAL BEAT INTERFERENCE NOISE IN RAMAN AMPLIFIERS

TECHNICAL BACKGROUND

The invention relates to a method and an apparatus for suppressing optical beat interference noise, in particular to a method to suppress pump mode optical beat interference in Raman amplified WDM systems.

When light is transmitted through an optical fiber the light signal can be scattered by the vibration of the glass structure of the optical fiber. A Raman amplifier is a type of an optical amplifier used in fiber optic transmission systems. The Raman amplification is based on the stimulated Raman scattering phenomenon where a lower frequency signal photon uses a scattering of a higher frequency power pump photon in an optical medium in the non-linear regime. As a result of this, another signal photon is produced, wherein the surplus energy resonantly passes through the vibrational states of the medium. Raman amplifiers can be deployed in ultra long-haul, long-haul, regional and metro-core fiber optic transmission systems. Distributed Raman amplifiers improve the optical signal to noise ratio and reduce the non-linear penalty of fiber systems, allowing for longer reach, longer amplifiers spans, higher bit rates, higher number of channels, closer channel spacing and operation near the fiber zero dispersion wavelength. Raman scattering of internal light with photons of the gain medium produces photons coherent with the incoming photons. In a Raman amplifier the optical signal can be amplified by Raman amplification.

Different types of Raman amplifiers are known, e.g. a distributed and a lumped Raman amplifier.

A distributed Raman amplifier is a Raman amplifier in which the transmission line optical fiber is utilized as the gain medium by multiplexing a pump wavelength with a signal wavelength, whereas a lump Raman amplifier utilizes a dedicated self-contained shorter length of optical fiber to provide amplification. In the case of a lumped Raman amplifier a highly non-linear fiber with a small core such as a dispersion compensating fiber is utilized to increase the interaction between the signal and the pump wavelength. The pump light may be coupled into the transmission fiber in the same direction as a signal (so-called co-directional pumping), in the opposite direction (counter-directional pumping) or in both directions (bidirectional pumping).

In a co-pumped Raman pump signal relative intensity noise transfer limits the system signal to noise performance of wavelength division multiplexed (WDM) signal channels.

When using polarization multiplexed pump lasers of similar wavelengths optical beat interference, OBI, can induce sudden and sporadic signal gain and noise variations on the WDM channels. The pump optical beat interference coupled with a non-linear pump signal transfer process within this optical fiber is responsible for this phenomenon. Distributed Raman amplifiers are sensitive to the sudden and large noise power variations which can cause receivers to loose clock and data recovery for a long period. Large noise power variations may occur randomly over time or at some Raman amplifier gain settings. Accordingly, there is a need to provide a method and apparatus for suppressing optical beat interference noise in an optical network using Raman amplifiers having polarization multiplexed pump lasers.

SUMMARY OF THE INVENTION

The invention provides a method for suppressing optical beat interference noise in a fiber link of an optical network, wherein a wavelength of a laser beam generated by a first pump laser and a wavelength of a laser beam generated by a second pump laser of a pair of polarization multiplexed pump lasers are detuned with respect to each other to suppress the optical beat interference, OBI, noise in the fiber link of said optical network.

The invention further provides a pump signal generation apparatus adapted to generate a pump signal with suppressed optical beat interference, OBI, noise in a fiber link of an optical network, said apparatus comprising at least one pair of polarization multiplexed pump lasers having wavelengths which are detuned with respect to each other to suppress the optical beat interference, OBI, noise in the fiber link of said optical network.

In a possible embodiment of the apparatus according to the present invention each pair of polarization multiplexed pump lasers comprises a first pump laser and a second pump laser connected to a corresponding polarization beam combiner adapted to combine the orthogonal polarized laser beams generated by the first and second pump laser.

In a still further embodiment of the apparatus according to the present invention a wavelength of a laser beam generated by the first pump laser and a wavelength of a laser beam generated by the second pump laser of each pair of polarization multiplexed pump lasers are detuned with respect to each other to suppress the optical beat interference noise.

In a further possible embodiment of the apparatus according to the present invention each pair of polarization multiplexed pump lasers is connected to a tuning circuit adapted to offset the center wavelengths of the polarization multiplexed pump lasers.

In a further possible embodiment of the apparatus according to the present invention both wavelengths of the laser beams are detuned with respect to each other by said tuning circuit which is adapted to detune temperatures of the respective pump lasers of said pair of polarization multiplexed pump lasers.

In a further possible embodiment of the apparatus according to the present invention a wavelength difference between a first center wavelength of the first pump laser and a second center wavelength of the second pump laser is set such that it exceeds a predetermined minimum wavelength difference.

In a possible embodiment of the apparatus according to the present invention the minimum wavelength difference is in a range between 0.25 nm and 0.3 nm.

In a specific implementation of the apparatus according to the present invention the minimum wavelength difference is set to be 0.28 nm.

In a still further possible embodiment of the apparatus according to the present invention a wavelength difference between a first center wavelength of a first pump laser and a second center wavelength of a second pump laser is set such that it does not exceed a predetermined maximum wavelength difference to minimize a polarization dependent gain.

In a further possible embodiment of the apparatus according to the present invention said maximum wavelength difference is in a range between 10 nm and 15 nm.

In a specific advantageous implementation the maximum wavelength difference is set to be 11.3 nm.

In a possible embodiment of the apparatus according to the present invention the polarization multiplexed pump lasers are formed by Fabry-Perot lasers each having a center wavelength stabilized by an external fiber Bragg grating or formed by multi-longitudinal mode DFB lasers.

In a possible embodiment of the apparatus according to the present invention said polarization beam combiners of different pairs of polarization multiplexed pump lasers are connected to a WDM multiplexer.

The invention further provides a Raman amplifier comprising at least one pump signal generation apparatus adapted to generate a pump signal with suppressed optical beat interference noise comprising at least one pair of polarization multiplexed pump lasers having wavelengths which are detuned with respect to each other to suppress the optical beat interference, OBI, noise in the fiber link of an optical network, wherein said Raman amplifier further comprises a WDM multiplexer adapted to multiplex an optical pump signal generated by said pump signal generation apparatus with optical data signals to generate an optical transmission signal supplied to a transmission line fiber of said fiber link.

In a possible embodiment of the Raman amplifier according to the present invention said Raman amplifier is a co-pumped Raman amplifier.

In a further possible embodiment of the Raman amplifier according to the present invention said Raman amplifier is a distributed Raman amplifier or a lumped Raman amplifier.

The invention further provides a wavelength division multiplexing system comprising at least one Raman amplifier having at least one pump signal generation apparatus adapted to generate a pump signal with suppressed optical beat interference, OBI, noise in a fiber link of an optical network, said signal generation apparatus comprising at least one pair of polarization multiplexed pump lasers having wavelengths which are detuned with respect to each other to suppress the optical beat interference, OBI, noise in the fiber link of said optical network, said Raman amplifier further comprising a WDM multiplexer adapted to multiplex an optical pump signal generated by said pump signal generation apparatus with optical data signals to generate an optical transmission signal supplied to a transmission line fiber of said fiber link.

DETAILED DESCRIPTION OF EMBODIMENTS

In the following possible embodiments and implementations of an apparatus and a method for suppressing optical beat interference noise in an optical network are explained in more detail with reference to the enclosed figures.

Figure 1:
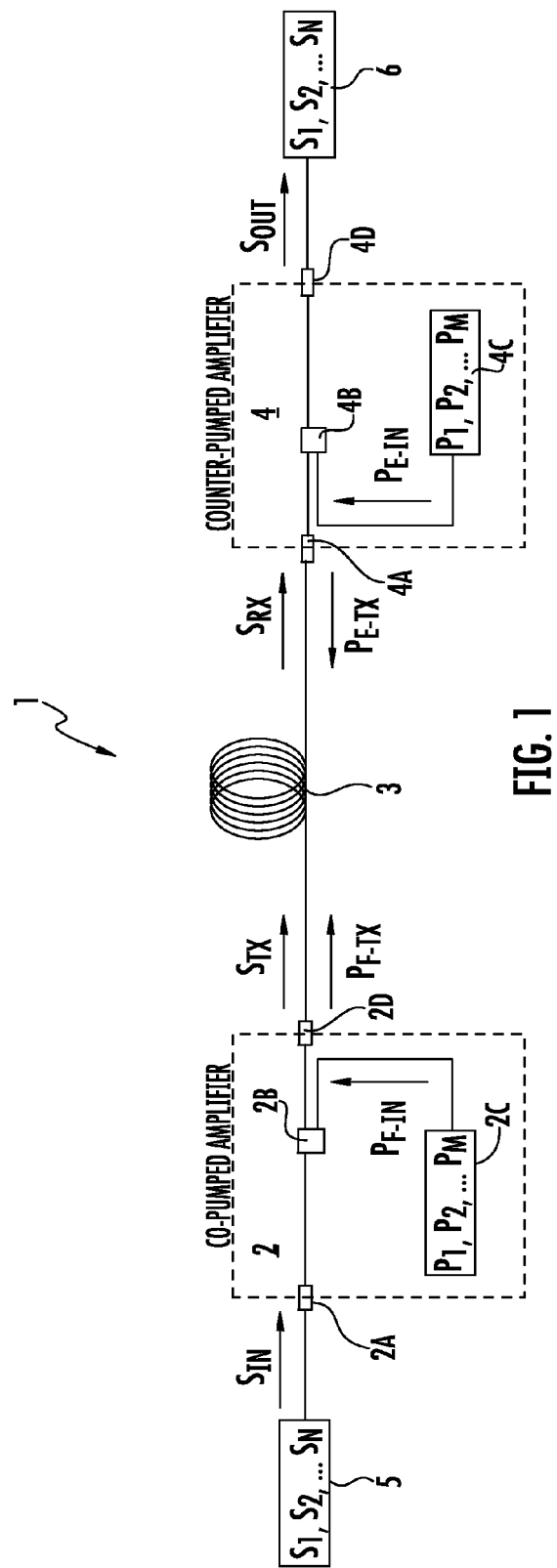
FIG. 1 shows a block diagram of a possible implementation of a Raman amplified WDM system according to the-present invention.

As can be seen from FIG. 1 the optical network 1 according to the present invention can comprise at least one co-pumped optical amplifier 2 connected via a transmission line fiber 3 of a fiber link to a counter-pumped optical amplifier 4 as shown in FIG. 1. The co-pumped amplifier 2 is an optical amplifier, in particular a co-pumped optical Raman amplifier. The counter-pumped amplifier 4 is an optical amplifier, in particular a counter-pumped Raman amplifier. The co-pumped optical amplifier 2 is connected at its input 3A to an optical signal source 5 supplying optical data signals $S_1, S_2, \ldots, S_N$ which are wavelength division multiplexed. The co-pumped Raman amplifier 2 comprises a WDM multiplexer 2B to which the pump signal generation apparatus 2C is connected as shown in FIG. 1. The WDM multiplexer 2B is adapted to multiplex the optical pump signals $P_1, P_2, \ldots, P_M$ generated by the pump signal generation apparatus 2C with the optical data signals $S_1, S_2, \ldots, S_N$ to generate an optical transmission signal supplied to the transmission line fiber 3 of said fiber link at the output 2D of the co-pumped amplifier 2. The optical transmission signal travels through the transmission line fiber 3 to an input 4A of the counter-pumped Raman amplifier 4 as shown in FIG. 1. The counter-pumped amplifier 4 comprises in the shown embodiment a WDM multiplexer 4B connected to the pump signal generation apparatus 4C. The output 4D of the counter-pumped optical amplifier 4 sends out the optical data signal to a data signal evaluation unit 6 as shown in FIG. 1. The performance of the co- and counter-pumped Raman amplifiers 2, 4 as shown in FIG. 1, can be constrained by signal polarization dependent gain PDG, signal-pump-signal depletion modulation crosstalk and pump-signal intensity noise transfer. Optical data signals are wavelength division multiplexed at the remote node. The pump signals $P_1, P_2, \ldots, P_M$ generated by the pump signal generation apparatus 2C or by the pump signal generation apparatus 4C are polarization multiplexed and wavelength division multiplexed at the local Raman amplifiers.

The signal-pump-signal depletion modulation crosstalk and pump-signal intensity noise transfer can be minimized in a counter-pumped Raman amplifier configuration. The signal polarization dependent gain PDG in both co- or counter-pumped Raman amplifier of the optical network 1 as shown in FIG. 1 are reduced by using pump lasers having an identical center wavelength, identical optical power and orthogonal polarization directions. The polarization direction of the pump fields are ideally orthogonal whereas the polarization direction of each signal field travelling along the transmission line fiber 3 have arbitrary direction of propagation.

In the implementation as shown in FIG. 1 the optical network 1 is a Raman amplified WDM optical system comprising a pump signal generation apparatus 2C, 4C, a co-pumped amplifier 2 and a counter-pumped amplifier 4. The pump signal generation apparatus used in the optical amplifiers 2, 4 is adapted to generate a pump signal with suppressed optical beat interference, OBI, noise in the fiber link of the optical network 1.

The used optical pump signal generation apparatus 2C, 4C comprises at least one pair of polarization multiplexed pump lasers having wavelengths $\lambda_1$ and $\lambda_2$ which are slightly detuned with respect to each other to suppress the optical beat interference, OBI noise in the fiber link of the optical network 1.

Figure 2:
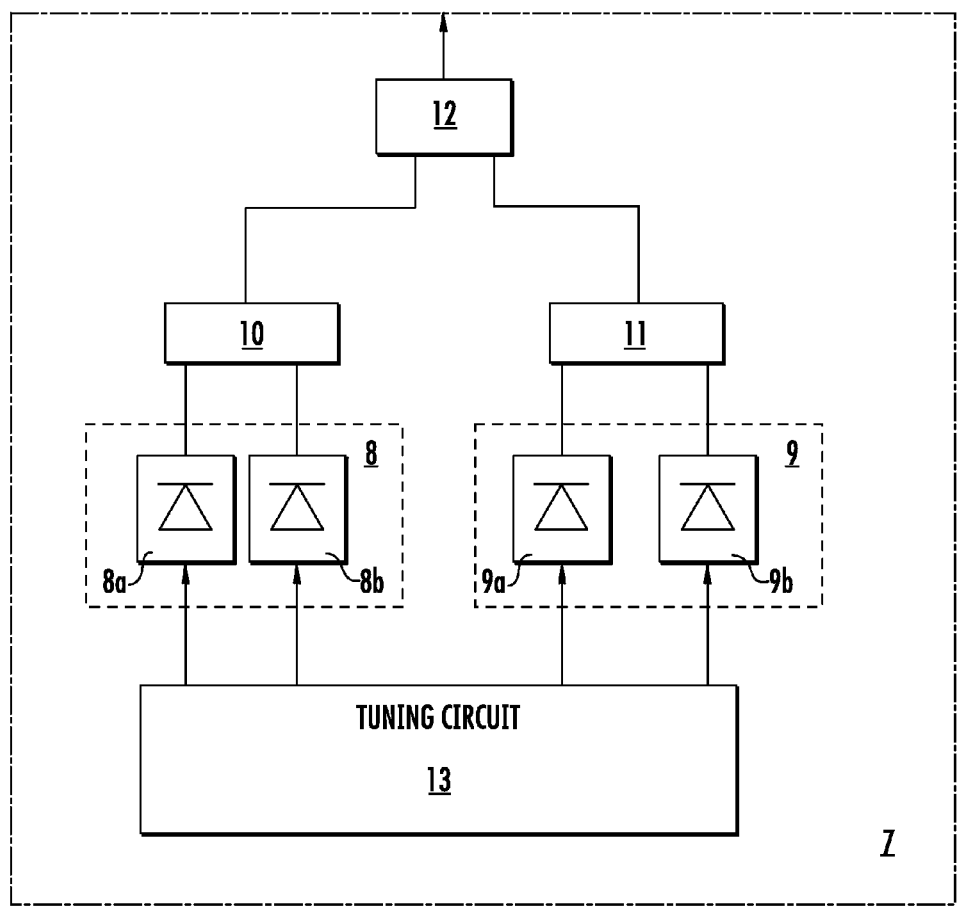
FIG. 2 shows a block diagram of a possible implementation of a pump signal generation apparatus with suppressed optical beat interference according to the present invention.

FIG. 2 shows a block diagram of a possible implementation of pump signal generation apparatus 7 according to the present invention which is adapted to generate a pump signal with a suppressed or reduced optical beat interference noise in the fiber link of the optical network 1. The pump signal generation apparatus 7 can form the pump signal generation apparatus 2C used in the co-pumped amplifier 2 or the pump signal generation apparatus 4C used in the counter-pumped amplifier 4 of the network shown in FIG. 1

As can be shown in the embodiment of FIG. 2 the optical pump signal generation apparatus 7 comprises in the shown embodiment two pairs 8, 9 of orthogonal polarization multiplexed pump lasers. Each pair 8, 9 of polarization multiplexed pump lasers comprises a first pump laser 8A, 9A and a second pump laser 8B, 9B connected to a corresponding polarization beam combiner 10, 11, as shown in FIG. 2. The polarization beam combiner PBC 9, 10 is adapted to combine the orthogonal polarized laser beams generated by the first and second pump laser of the respective orthogonal pump laser pair. Optical signals of the polarization beam combiners 10, 11 can be applied to a WDM multiplexer 12 of the pump signal generation apparatus 7. The wavelength of the laser beam generated by the first pump laser 8A and the wavelength of a laser beam generated by the second pump laser BE of first pair 8 of the polarization multiplexed pump lasers are detuned with respect to each other to suppress an optical beat interference, OBI, noise in a fiber link of the network 1. The wavelength of the laser beam generated by the first pump laser 9A and a wavelength of a laser beam generated by the second pump laser 9B of the second pair 9 of polarization multiplexed pump lasers are also detuned with respect to each other to suppress optical beat interference, OBI, noise in the fiber link of the optical network 1.

As can be seen in FIG. 2 in the shown implementation each pair 8, 9 of polarization multiplexed pump lasers is connected to a tuning circuit 13 which is adapted to offset a center wavelength of the polarization multiplexed pump lasers. In a possible embodiment both wavelengths λ1, λ2 of the laser beams generated by the polarization multiplexed pump lasers are detuned with respect to each other by said tuning circuit 13 which is adapted to detune temperatures T of the respective pump lasers 8A, 8B, 9A, 9B of said pairs 8, 9 of polarization multiplexed pump lasers. In a possible Implementation a pump laser can be formed by a Fabry-Perot laser having a center wavelength stabilized by an external fiber Bragg grating or a multi-longitudinal mode DFB laser. A stable center wavelength pump laser source with wide spectral width can be provided using multi-longitudinal modes to suppress SBS and to provide a tailored flat Raman gain in the signal band. The interaction of the pump vector and signal vector results in a Raman amplification with a low polarization dependent gain PDG.

Figure 3:
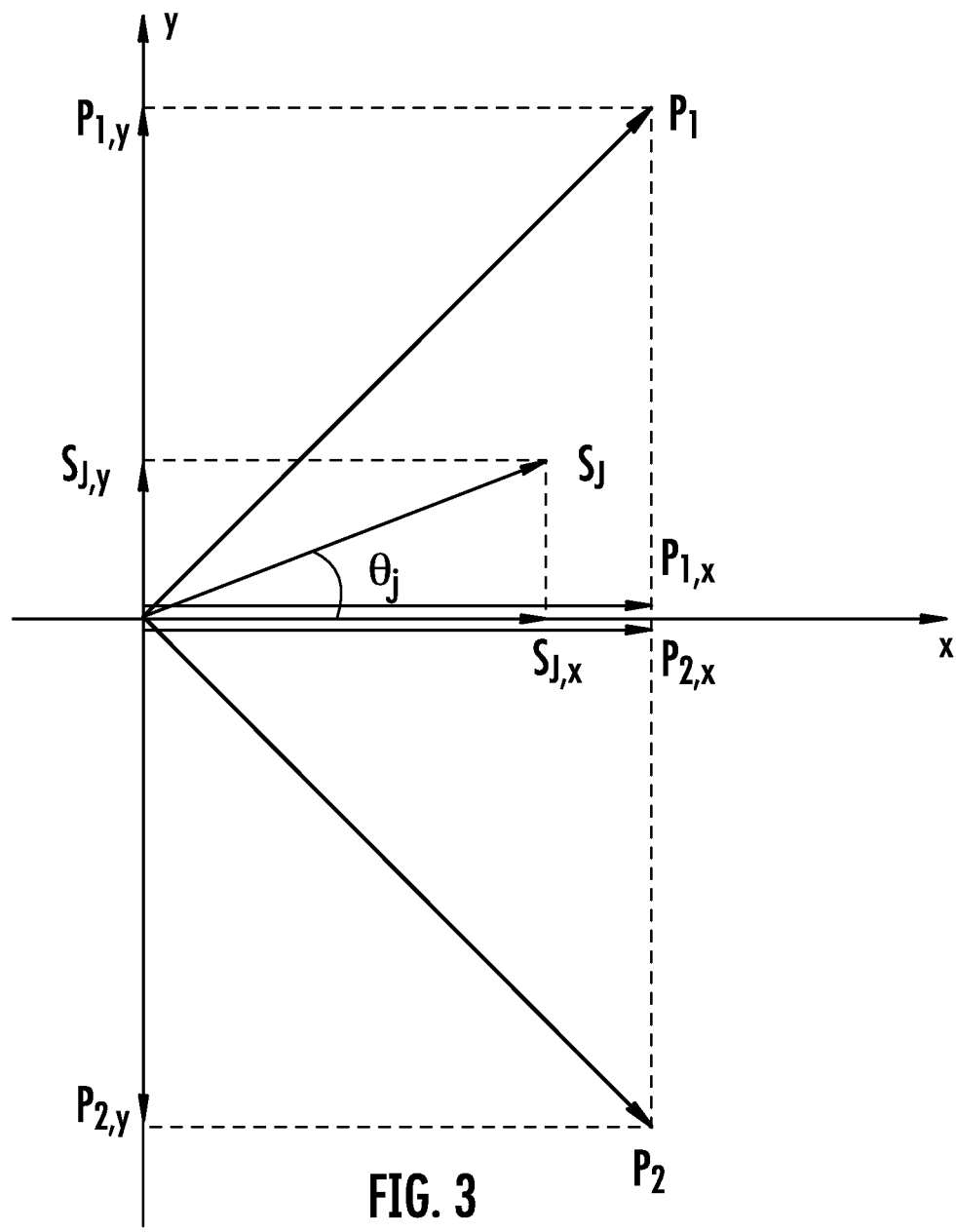
FIG. 3 shows a vector diagram showing pump and signal laser polarization directions for illustrating operation of an apparatus according to the present invention.

FIG. 3 shows a vector diagram illustrating pump and signal laser polarization directions. FIG. 3 shows orthogonal polarization states of a first and second pump laser source obtained after polarization multiplexing using a polarization beam combiner PBC located at the Raman amplifier and the polarization state of the $j^{th}$ data signal laser source after the wavelength division multiplexing WDM component. An angle $\theta_j$ can be defined as the angle between the x-axis and the polarization state of the $j^{th}$ signal laser source. The x-component of the optical signal is amplified by the x-component of pump laser $P_{1,x}$ and pump laser $P_{2,x}$. Similarly, the y-component of the signal is amplified by the y-component of the pump laser sources $P_{1,y}$ and $P_{2,y}$.

The Raman gain is the optical gain or amplification arising from stimulated Raman scattering. The Raman gain occurs in transparent solid media of optical fiber.

In the pump signal generation apparatus 7 according to the present invention the Raman signal gain in the x-axis is defined by:

$$G_x = \exp\{C_R \cdot |e_x|^2 \cdot L_{eff}\} \quad (1)$$

wherein $C_R$ is the Raman gain efficiency,
$L_{eff}$ is the effective fiber length.

$$|e_x|^2 = P_{1,x} + P_{2,x} + 2\sqrt{P_{1,x} P_{2,x}} \cos(2\pi \delta f t + \phi_1 - \phi_2) \quad (2)$$

$$\delta f = c\left(\frac{1}{\lambda_1} - \frac{1}{\lambda_2}\right) \quad (3)$$

wherein $|e_x|^2$ is the pump power in x-direction and $\delta f$ is the frequency offset related to the wavelength offset $\delta\lambda$ as shown above of the pump laser sources. Raman signal gain in the y-direction can be expressed in the same way as defined by equations (1) to (2).

Figure 4A:
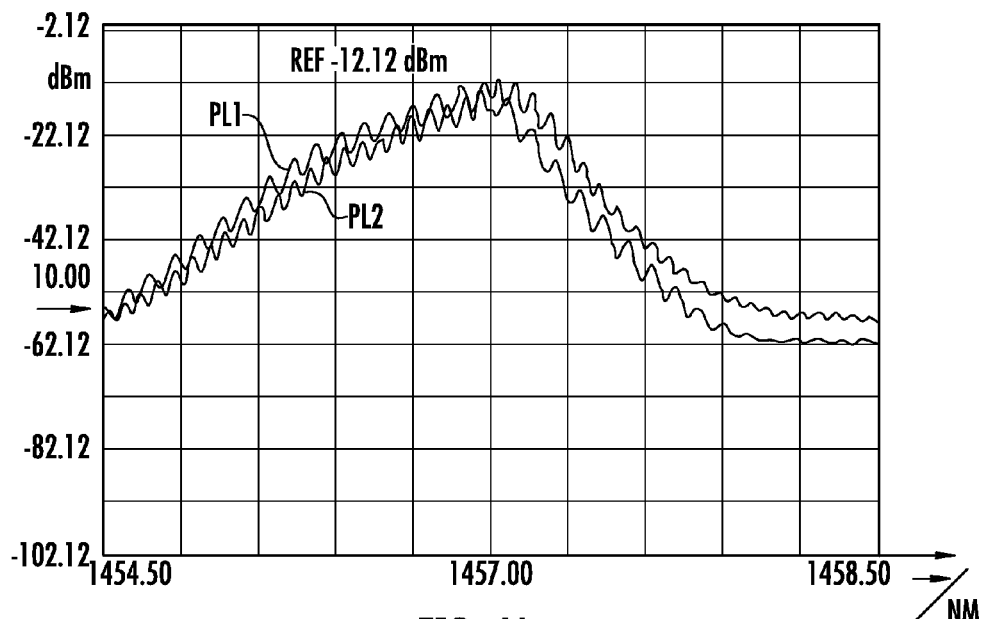
FIG. 4A, 4B shows diagrams for illustrating an optical spectrum of two polarization division multiplexed pump lasers for illustrating the operation of the apparatus according to the present invention.
Figure 4B:
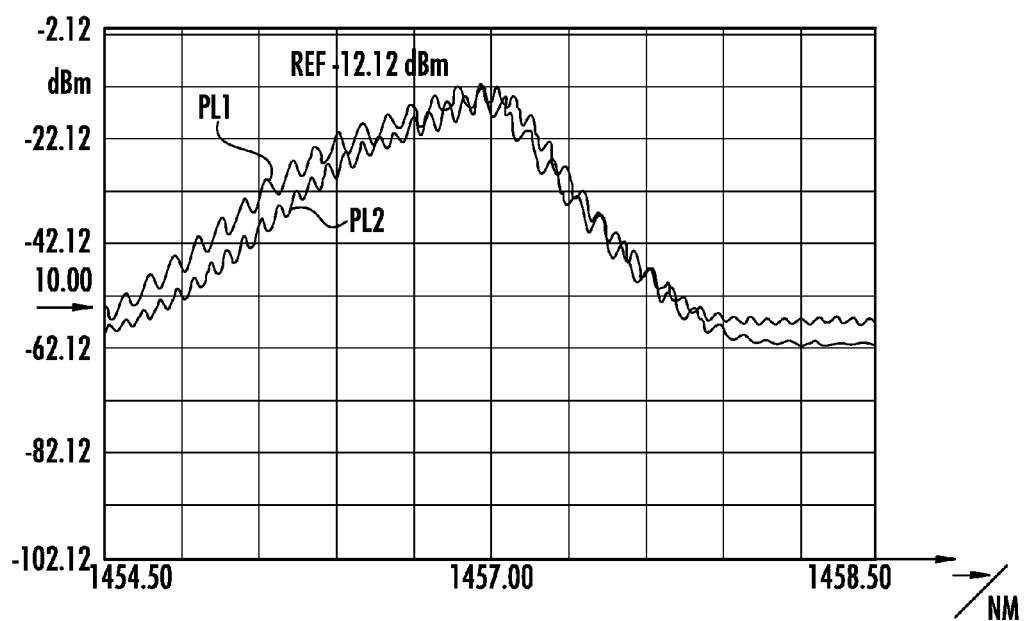

The optical beat interference OBI is generated by the mixing of the pump signals through the Raman amplification process as expressed by the third term in equation (2). FIG. 4A shows an optical spectrum of a polarization multiplexed pump laser where a temperature T of both pump lasers are controlled to be 25° C. (T=25° C.). FIG. 4B illustrates when the temperature T of one of the two pump laser sources is tuned to a higher temperature of 40° C. In a possible implementation the tuning of the temperature T of the laser sources can be performed by a tuning circuit 13 as shown in FIG. 2. The wavelength of the laser beams generated by the pump laser sources can be detuned with respect to each other by the tuning circuit 13 which detunes the temperatures T of the respective pump lasers or laser sources of a pair of polarization multiplexed pump lasers. The temperature T of one pump laser is varied and results in a change of the relative center wavelengths of the two pump laser sources as shown in FIG. 4B. The optical spectrum shown in FIG. 4A shows the spectrum of a first pump laser PL1 and of a second pump laser PL2 tuned to a temperature of T=25° C. In contrast, in the diagram of FIG. 4B the optical spectrum of the first pump laser PL1 is the same as in FIG. 4A and corresponding to a tuning temperature T of 25° C., whereas the optical spectrum of the second pump laser PL2 is shifted slightly by tuning its temperature T to a higher temperature of 40° C. FIGS. 4A, 4B show an optical spectrum of two polarization division multiplexed pump lasers with center wavelengths nominally at 1457 nm and the temperatures T of the two pump lasers being controlled to be at 25° C. in the diagram of FIG. 4A. If the temperature of one pump laser is tuned from 25° C. to 40° C. as shown in the diagram of FIG. 4B an optical beat interference, OBI, does occur with the result of the coupling of the two orthogonal pump modes followed by the Raman signal amplification process.

The occurred optical beat interference, OBI, can be enhanced due to an optical Kerr effect, non-linear polarization rotation of the pump fields in the fiber, and polarization coupling of the pump fields caused by non-ideal pump PDM and WDM components in the Raman amplifiers. As can be seen from FIGS. 4A, 4B, the main longitudinal mode overlaps as shown in FIG. 4B. The longitudinal mode of the pump laser source can follow a Lorentzian shaped power spectrum. The optical power spectrum of the ith pump laser source has several longitudinal modes. The mixing of the Raman amplified signal wavelength through photodetection process can produce a degradation in optical signal-to-noise ratio OSNR due to pump mode optical interference noise transferred to the signal by:

$$OSNR_{OBI} = \frac{\pi}{4\sum_j k_{1,j} k_{2,j} B_o}\left[\frac{\Delta f^2 + \delta f^2}{\Delta f}\right] \quad (4)$$

wherein $k_{1,j}$ and $k_{2,j}$ are the relative intensities of the pump laser longitudinal modes in the x and y polarization directions, $\Delta f = \Delta f_1 + \Delta f_2$ is the sum of the spectral width of each pump source longitudinal mode, and $\delta f$ is the frequency difference of the two orthogonally polarized pump sources, and $B_0$ is the optical bandwidth.

As the source linewidth increases, for example, due to dithering, the optical signal-to-noise ratio OSNR improves.

For typical pump laser values $\Sigma k_{1,j} k_{2,j} = 0.125$ and $\Delta f_1 = \Delta f_2 = 1.25$ GHz ($\Delta\lambda = 0.01$ nm) the optical signal-to-noise ratio of the optical beat interference $OSNR_{OBI} = 36.5$ dB when $\delta\lambda = 0.3$ nm, i.e. when the pump mode overlap does not occur, and $OSNR_{OBI} = 27$ dB when $\delta\lambda = 0.1$ nm, i.e. when the pump mode overlap occurs.

The optical signal-noise-ratio OSNR improvement provided by the pump signal generation apparatus according to the present invention can be large for a small detuning factor. The OSNR penalty expression given below provides the detuning factor. As a rule of thumb, when a WDM system uses a co-pumped Raman amplifier, a 0.5 dB OSNR penalty must be allocated. The OSNR penalty expression for such penalties is given as $$\varepsilon = -10\log\left(1 - 2Q^2 \frac{R_b}{B_o OSNR_{OBI}}\right) \quad (5)$$

Wherein, $B_o$ is the optical filter bandwidth, $R_b$ is the baud-rate and

Q is a factor related to the required bit error rate, BER, during signal transmission.

Accordingly, the required frequency difference can be expressed as follows:

$$\delta f \geq \sqrt{\frac{10}{\pi} Q^2 \sum_j k_{1,j} k_{2,j} R_b \Delta f - \Delta f^2} \quad (6)$$

The pump laser wavelength difference can be calculated using equation (6) indicated above. For example, when $BER = 10^{-12}$ (responding to Q=7,036) is required for no FEC cases, it can be calculated through the required pump wavelength difference for different baud-rates $R_b$. Using digital modulation schemes such as NRZ, QPSK, and QAM does not require a baud-rate $R_b$ to be greater than 25 Gbaud/sec. Also, if FEC is used in higher data rate WDM systems the required Q factor may be lower. The universal expression given in equation (6) gives a minimum wavelength difference $\delta\lambda_{min} = 0.28$ nm (corresponding to $\delta f_{min} = 35$ GHz).

The maximum wavelength difference $\delta\lambda_{max}$ is governed by minimizing the polarization dependent gain, PDG. The PDG penalty in a wavelength division multiplexing system is to be $\delta G = 0.5$ dB. In an ideal system, the PDG penalty is 0 dB which implies $G_x = G_y$, however, in a real system gain in orthogonal directions are not equal, $G_y = G_x \pm \delta G$. Furthermore, in practical WDM systems, the Raman gain is nominally set at 16 dB or less.

$$\delta f \leq 13 THz (G_x - G_y)/G_x. \quad (7)$$

Accordingly, a maximum wavelength difference $\delta\lambda_{max}$ can be calculated to be $\delta\lambda_{max} 11.3$ nm (corresponding to $\delta f_{max} = 1.4$ THz).

We have conducted several experiments to measure the impact of pump mode optical interference noise in a WDM system with co- and counter-pumped Raman amplifier spans. The OSNR penalty of a WDM optical network system, shown in FIG. 1, is measured at a bit error rate $BER = 10^{-12}$ (corresponding to Q=7,036). The data channels were operated at a baud-rate $R_b = 10,709$ Gb/sec and data received by a fixed decision threshold receiver. The counter-/co-pump Raman amplifier gain settings where set at 20 dB/10 dB and 15 dB/15 dB. The set-up of the OSNR penalty of the Raman amplified WDM system 1 with and without the wavelength detuning can be compared with each other. The OSNR penalty was reduced from 1.5 dB to 0.5 dB for a 20 dB/10 dB Raman amplified WDM system 1 when the co-pump center wavelength is detuned to 0.3 nm. In a 15 dB/15 dB Raman amplifier gain setting, the 0.9 dB penalty is reduced less than 0.3 dB when pump wavelengths are detuned.

Figure 5A:
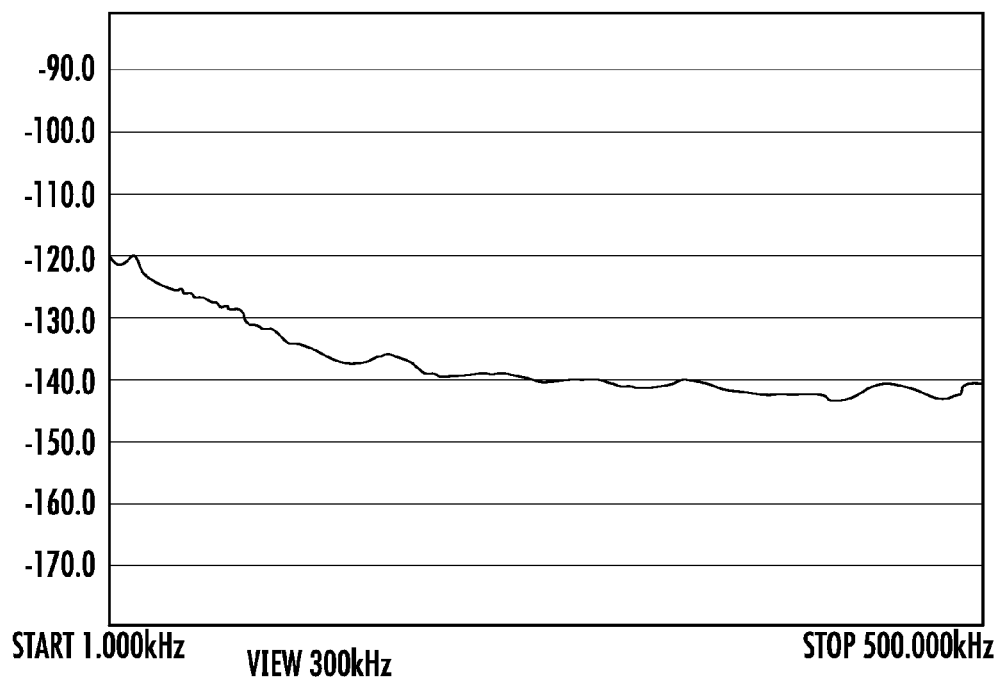
FIG. 5A, 5B shows diagrams showing averaged signal RIN spectrum for illustrating an operation of an apparatus according to the present invention.
Figure 5B:
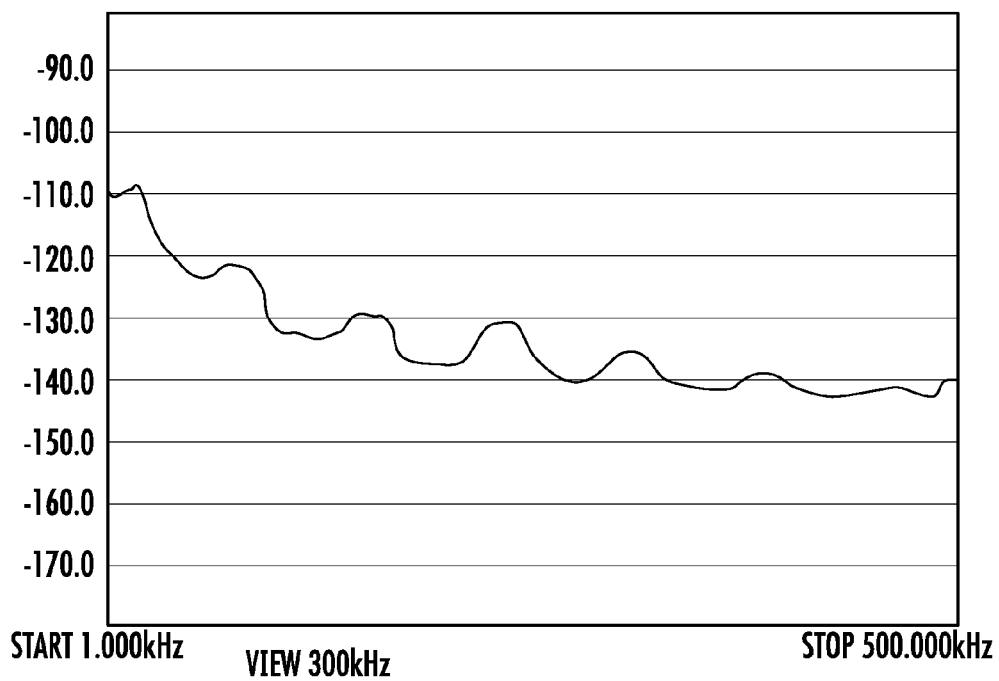

FIGS. 5A, 5B show an average signal RIN spectrum for a 120 km TWRS fiber having a counter-/co-pumped Raman amplifier set at 15 dB/15 dB. FIG. 5A shows the average signal RIN spectrum without pump mode interference (no longitudinal mode overlap) and FIG. 5B shows the average signal RIN spectrum with pump mode interference (with modes overlapping).

Accordingly, the spectrally averaged signal RIN of the Raman system with and without optical pump mode mixing is measured according to the diagrams of FIGS. 5A, 5B. FIGS. 5A and 5B compare the spectrally averaged signal RIN of a 80 channel WDM system when the temperature of a pump laser source is tuned from 25° C. to 40° C., respectively. An OSNR and RIN are related as:

$$OSNR = 10 \cdot \log\left(\frac{B_0}{B_e}\right) - RIN[dB] \quad (8)$$

When the center wavelength difference of the pump laser sources is increased by detuning through tuning the laser temperature T or selecting center wavelengths greater than 0.3 nm the pump mode interference noise and gain fluctuation is reduced drastically. A similar improvement can be reached when pump lasers are modulated by subcarrier modulation.

Accordingly, there are three different ways to reduce pump mode induced optical beat interference, OBI, noise in a Raman amplified WDM system.

In a first possible embodiment the detuning of the wavelength of the pump laser is performed by temperature tuning such that the wavelength difference $\delta\lambda$ is more than 0.3 nm ($\delta\lambda > 0.3$ nm).

A further possible embodiment can select pump sources with laser center wavelengths having a wavelength difference of more than 0.3 nm ($\delta\lambda > 0.3$ nm).

In a further possible embodiment RF modulation (dithering) pump source can be performed to broaden the spectral width of longitudinal modes.

The optical interference is the result of the mixing of two pump optical fields and a signal optical field due to the non-linear Raman scattering processes in the optical fiber of the fiber link. With the method according to the present invention by employing a detuned pump wavelength the optical beat interference, OBI, noise and signal gain fluctuations are eliminated to improve a signal-to-noise ratio SNR and a BER (bit error rate) performance of the optical WDM system according to the present invention.

The traffic pattern in a WDM optical communication system can change drastically when wavelengths (channels) are added or removed at the network and terminals, wavelengths are switched between deployed network fibers or when a fiber in the network is cut. Accordingly, the optical amplifiers deployed in the optical network may experience large optical power variations due to sudden changes caused by pump optical beat interference, OBI, within the network fiber link. When the WDM information channels are received at the end terminals of the WDM optical communication system these rapid gain variations do generate error bursts which degrade the signal quality.

With the apparatus and method according to the present invention it is possible to reduce these sudden and sporadic bit errors, in particular, in 10 G, 100 G, 400 G and 1 Tb/s, Raman amplified high capacity WDM systems. Accordingly, with the method and apparatus according to the present invention a transmission distance and regenerator spacing of high capacity WDM channels using Raman amplification can be extended.

The method and apparatus according to the present invention are provided to suppress optical beat interference, OBI, noise in a fiber link of the optical network 1. This is done in that a wavelength of a laser beam generated by a first pump laser and a wavelength of a laser beam generated by a second pump laser of a pair of polarization multiplexed pump lasers are detuned with respect to each other to suppress the optical beat interference, OBI, noise in the fiber link of the optical network. The wavelength difference $\delta\lambda$ between a first center wavelength of the first pump laser and a second center wavelength of the second pump laser is set such that it exceeds a predetermined minimum wavelength difference $\delta\lambda_{min}$. This minimum wavelength difference is in a preferred embodiment of the method and apparatus according to the present invention adjusted to be in a range between 0.25 nm and 0.3 nm. In a specific implementation the minimum wavelength difference $\delta\lambda_{min}$ is 0.28 nm.

Further, a wavelength difference between the first center wavelength of a first pump laser and a second center wavelength of a second pump laser is in a preferred embodiment set such that it does not exceed a predetermined maximum wavelength difference $\delta\lambda_{max}$ to minimize a polarization dependent gain PDG. In a possible implementation the maximum wavelength difference $\delta\lambda_{max}$ is set to be in a range between 10 nm and 15 nm. In a specific implementation the maximum wavelength difference is set to be 11.3 nm. Other Raman amplifiers used in the optical network, in particular in a WDM system 1 according to the present invention, can comprise co-pumped Raman amplifiers. These Raman amplifiers can be formed by distributed Raman amplifiers. In an alternative embodiment the used Raman amplifiers can be formed by lumped Raman amplifiers.

The invention claimed is:

1. A method for suppressing optical beat interference noise in a fiber link of an optical network, comprising:
   detuning a wavelength of a laser beam generated by a first pump laser and a wavelength of a laser beam generated by a second pump laser of a pair of polarization multiplexed pump lasers with respect to each other to by a tuning circuit, to suppress the optical beat interference (OBI) noise in the fiber link of the optical network
   wherein the tuning circuit is configured to detune wavelengths of the laser beams generated by each of the pair of polarization multiplexed pump lasers with respect to each other by detuning temperatures of the respective first and second pump lasers of the pair of polarization multiplexed pump lasers.

2. A pump signal generation apparatus adapted to generate a pump signal with suppressed optical beat interference (OBI) noise in a fiber link of an optical network, comprising:
   at least one pair of polarization multiplexed pump lasers comprising a first pump laser and a second pump laser; and
   a tuning circuit connected to each of the at least one pair of polarization multiplexed pump lasers;
   wherein the tuning circuit is configured to detune wavelengths of the laser beams generated by each of the at least one pair of polarization multiplexed pump lasers with respect to each other, thereby suppressing the OBI noise in the fiber link of the optical network; and
   wherein the tuning circuit is configured to detune temperatures of the respective first and second pump lasers of the pair of polarization multiplexed pump lasers.

3. The apparatus according to claim 2, wherein each pair of polarization multiplexed pump lasers is connected to a corresponding polarization beam combiner (PBC) adapted to combine the orthogonal polarized laser beams generated by the first and second pump laser.

4. The apparatus according to claim 3, wherein a wavelength difference between a first center wavelength of the first pump laser and a second center wavelength of the second pump laser is set such that it exceeds a predetermined minimum wavelength difference.

5. The apparatus according to claim 4, wherein the minimum wavelength difference is set to be in a range between 0.25 nm and 0.3 nm, in particular 0.28 nm.

6. The apparatus according to claim 3, wherein a wavelength difference between a first center wavelength of the first pump laser and a second center wavelength of the second pump laser is set such that it does not exceed a predetermined maximum wavelength difference to minimize a polarization dependent gain.

7. The apparatus according to claim 6, wherein the maximum wavelength difference is set to be in a range between 10 nm and 15 nm, in particular 11.3 nm.

8. The apparatus according to claim 3, wherein said polarization beam combiners of different pairs of polarization multiplexed pump lasers are connected to a WDM multiplexer.

9. The apparatus according to claim 2, wherein said polarization multiplexed pump lasers are Fabry-Perot lasers each having a center wavelength stabilized by an external fiber Bragg grating or multilongitudinal mode DFB lasers.

10. A Raman amplifier comprising at least one pump signal generation apparatus according to claim 2 and a WDM multiplexer adapted to multiplex an optical pump signal generated by said pump signal generation apparatus with optical data signals to generate an optical transmission signal supplied to a transmission line fiber of said fiber link.

11. The Raman amplifier according to claim 10, wherein said Raman amplifier is a co-pumped Raman amplifier.

12. The Raman amplifier according to claim 1, wherein said Raman amplifier is a distributed Raman amplifier or a lumped Raman amplifier.

13. A wavelength division multiplexing (WDM) system comprising at least one Raman amplifier according to claim 10.

* * * * *